(12) United States Patent
Hopper et al.

(10) Patent No.: US 6,406,960 B1
(45) Date of Patent: *Jun. 18, 2002

(54) PROCESS FOR FABRICATING AN ONO STRUCTURE HAVING A SILICON-RICH SILICON NITRIDE LAYER

(75) Inventors: Dawn M. Hopper; David K. Foote, both of San Jose; Bharath Rangarajan, Santa Clara; Arvind Halliyal, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/433,041

(22) Filed: Oct. 25, 1999

(51) Int. Cl.[7] .......................................... H01L 21/8247
(52) U.S. Cl. ...................... 438/261; 438/763; 438/954
(58) Field of Search ................. 438/971, 954, 438/261, 763

(56) References Cited

U.S. PATENT DOCUMENTS

| | | | | |
|---|---|---|---|---|
| 5,120,672 A | * | 6/1992 | Mitchell et al. | |
| 5,578,848 A | * | 11/1996 | Kwong et al. | 257/296 |
| 5,981,403 A | * | 11/1999 | Ma et al. | 438/758 |
| 6,051,511 A | * | 4/2000 | Thakur et al. | 438/791 |
| 6,063,666 A | * | 5/2000 | Chang et al. | 438/261 |
| 6,245,617 B1 | * | 6/2001 | Yang et al. | 438/287 |
| 6,248,628 B1 | * | 6/2001 | Halliyal et al. | 438/257 |
| 6,326,268 B1 | * | 12/2001 | Park et al. | 438/262 |

OTHER PUBLICATIONS

Wolf et al., "Silicon Processing for the VLSI Era vol. 1: Process Technology", pp. 183–194, Lattice Press, 1986.*

* cited by examiner

Primary Examiner—Richard Booth
(74) Attorney, Agent, or Firm—Amin & Turocy, LLP

(57) ABSTRACT

A process for fabricating an ONO layer in a non-volatile memory device including the steps of forming a first silicon oxide layer, a silicon-rich silicon nitride layer and a second silicon oxide layer. The silicon-rich silicon nitride layer is formed by either a PECVD process, an LPCVD, or an RTCVD process. The silicon-rich silicon nitride layer effectively holds electrical charge making the ONO layer particularly useful as a floating gate electrode in a two-bit EEPROM device.

6 Claims, 3 Drawing Sheets

PROCESS FOR FABRICATING AN ONO STRUCTURE HAVING A SILICON-RICH SILICON NITRIDE LAYER

CROSS REFERENCE TO RELATED APPLICATIONS

Related subject matter is disclosed in the following co-pending and commonly assigned U.S. patent applications filed on an even date herewith, and are all herein incorporated by reference.

U.S. patent application Ser. No. 09/426,239 now U.S. Pat. No. 6,218,227. "A METHOD TO GENERATE A MONOS TYPE FLASH CELL USING POLYCRYSTALLINE SILICON AS AN ONO TOP LAYER", U.S. patent application Ser. No. 09/426,255 now U.S. Pat. No. 6,207,502. "METHOD OF USING SOURCE/DRAIN NITRIDE FOR PERIPHERY FIELD OXIDE AND BIT-LINE OXIDE", U.S patent application Ser. No. 09/426,672 now U.S. Pat. No. 6,265,268. "HIGH TEMPERATURE OXIDE DEPOSITION PROCESS FOR FABRICATING AN ONO FLOATING-GATE ELECTRODE IN A TWO-BIT EEPROM DEVICE", U.S. patent application Ser. No. 09/426,240 now U.S. Pat. No. 6,180,538. "PROCESS FOR FABRICATING AN ONO FLOATING-GATE ELECTRODE IN A TWO-BIT EEPROM DEVICE USING RAPID-THERMAL-CHEMICAL-VAPOR-DEPOSITION", U.S. patent application Ser. No. 09/426,430 now U.S. Pat. No. 6,248,628. "METHOD OF FABRICATING AN ONO DIELECTRIC BY NITRIDATION FOR MNOS MEMORY CELLS", U.S. patent application Ser. 09/433,041. "PROCESS FOR FABRICATING AN ONO STRUCTURE".

U.S patent application Ser. NO. 09/433,037 now U.S. Pat. No. 6,319,775. "NITRIDATION PROCESS FOR FABRICATING AN ONO FLOATING-GATE ELECTRODE IN A TWO-BIT EEPROM DEVICE".

FIELD OF THE INVENTION

The present invention relates, in general, to non-volatile memory devices and to methods for their fabrication and, more particularly, to the fabrication of ONO layers in non-volatile memory devices.

BACKGROUND OF THE INVENTION

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM) and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

In a flash EEPROM device, electrons are transferred to a floating-gate electrode through a dielectric layer overlying the channel region of the enhancement transistor. The electron transfer is initiated by either hot electron injection or by Fowler-Nordheim tunneling. In either electron transfer mechanism, a voltage potential is applied to the floating-gate by an overlying control-gate electrode. The control-gate electrode is capacitively coupled to the floating-gate electrode, such that a voltage applied on the control-gate electrode is coupled to the floating-gate electrode. The flash EEPROM device is programmed by applying a high positive voltage to the control-gate electrode and a lower positive voltage to the drain region, which transfers electrons from the channel region to the floating-gate electrode. The flash EEPROM device is erased by grounding the control-gate electrode and applying a high positive voltage through either the source or drain region of the enhancement transistor. Under erase voltage conditions, electrons are removed from the floating-gate electrode and transferred into either the source or drain regions in the semiconductor substrate.

Product development efforts in EEPROM device technology have focused on increasing the programming speed, lowering programming and reading voltages, increasing data retention time, reducing cell erasure times and reducing cell dimensions. Many of the foregoing research goals can be addressed through development of materials and processes for the fabrication of the floating-gate electrode. Recently, development efforts have focused on dielectric materials for fabrication of the floating-gate electrode. Silicon nitride in combination with silicon dioxide is known to provide satisfactory dielectric separation between the control-gate electrode and the channel region of the enhancement transistor, while possessing electrical characteristics sufficient to store electrical charge.

One important dielectric material for the fabrication of the floating-gate electrode is an oxide-nitride-oxide (ONO) structure. During programming, electrical charge is transferred from the substrate to the silicon nitride layer in the ONO structure. Voltages are applied to the gate and drain creating vertical and lateral electric fields which accelerate the electrons along the length of the channel. As the electrons move along the channel, some of them gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer. This type of non-volatile memory device is known as a two-bit EEPROM. The two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two-bits to be programmed and read simultaneously. The two-bits of the memory cell can be individually erased by applying suitable erase voltages to the gate and to either the source or drain regions.

While the recent advances in EEPROM technology have enabled memory designers to double the memory capacity of EEPROM arrays using two-bit data storage, numerous challenges exist in the fabrication of material layers within these devices. In particular, the ONO layer must be carefully fabricated to avoid the creation of interface states that could provide charge leakage paths within the ONO layer. Accordingly, advances in ONO fabrication technology are necessary to insure proper charge isolation in ONO structures used in two-bit EEPROM devices.

SUMMARY OF THE INVENTION

The present invention is for a process for fabricating an ONO structure that can be part of a floating-gate electrode in a two-bit EEPROM device, or a dielectric layer in a stacked-gate device. Fabrication of a two-bit EEPROM device or a stacked-gate device using an ONO structure requires the formation of a high quality ONO layer. In the case of a two-bit EEPROM device, this is because proper functionality of the two-bit EEPROM device requires localized charge storage within the ONO structure. In particular, the silicon nitride layer must have the ability to hold electrical charge introduced from the substrate. In a properly formed ONO structure, all electrical charge is stored in the silicon nitride layer. By fabricating a silicon-rich silicon nitride layer, stored charge in the ONO structure remains localized within predetermined regions in the silicon nitride layer. When used as a dielectric layer in a stacked-gate device, the ONO structure must electrically isolate a floating-gate electrode from a control-gate electrode.

In one form, a process for fabricating an ONO floating-gate electrode includes providing a semiconductor substrate and forming a first silicon oxide layer on the semiconductor substrate. Then, a silicon-rich silicon nitride layer is formed to overlie the first silicon oxide layer. A second layer of silicon oxide is then formed to overlie the silicon nitride layer.

Figure 1:
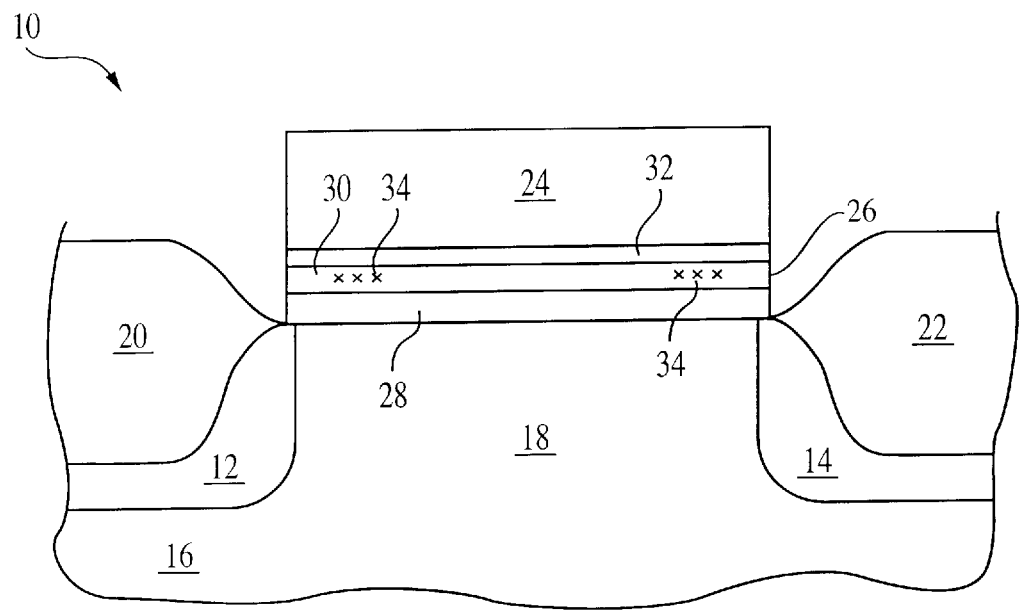
FIG. 1 illustrates, in cross-section, a portion of a semiconductor substrate containing a floating-gate transistor that incorporates an ONO structure fabricated in accordance with the invention.

It should be appreciated that, for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

Shown in FIG. 1, in cross-section, is a floating-gate transistor 10 suitable for use in a two-bit EEPROM device. Floating-gate transistor 10 includes source/drain regions 12 and 14 located in a semiconductor substrate 16 and separated by a channel region 18. First and second bit line oxide regions 20 and 22 overlie source/drain regions 12 and 14, respectively. A control gate electrode 24 overlies channel region 18 and is separated therefrom by an ONO structure 26. Control gate electrode 24 and ONO structure 26 form a stacked-gate structure.

ONO structure 26 includes a first silicon oxide layer 28 overlying channel region 18. A silicon-rich silicon nitride layer 30 overlies first silicon oxide layer 28. A second silicon oxide layer (or top oxide layer) 32 overlies silicon nitride layer 30.

In the operation of floating-gate transistor 10, voltages are applied to control-gate electrode 24 and to source/drain regions 12 and 14 that cause electrical charge from source/drain regions 12 and 14 to propagate across channel region 18. Once the charge encounters a sufficiently strong vertical field, the charge is either injected or tunnels from channel region 18 into silicon nitride layer 30. For example, depending upon the particular voltage levels applied to control-gate electrode 24 and to source/drain regions 12 and 14, electrical charge 34 is transferred into silicon nitride layer 30 and is localized to regions in proximity to either source/drain region 12, or source/drain region 14.

Those skilled in the art will recognize that the proper functioning of a two-bit EEPROM device necessarily requires that electrical charge 34 remain isolated in the regions of silicon nitride layer 30 to which it is initially introduced. The proper maintenance of electrical charge 34 in localized regions of silicon nitride layer 30 is critical to the proper performance of a two-bit EEPROM device. In particular, the quality of ONO structure 26 must be such that charge leakage paths are minimized at the interface between the first and second silicon oxide layers 28 and 32 and silicon nitride layer. Additionally, silicon nitride layer 30 must be of sufficient density, such that charge trapping sites are formed within the silicon nitride material.

In accordance with the invention, charge leakage within ONO structure 26 is minimized by forming a high quality ONO layer. The reduced charge leakage and improved floating-gate transistor performance obtained by the present invention can be better understood following a description of an ONO fabrication process carried out in accordance with the invention.

Figure 2:
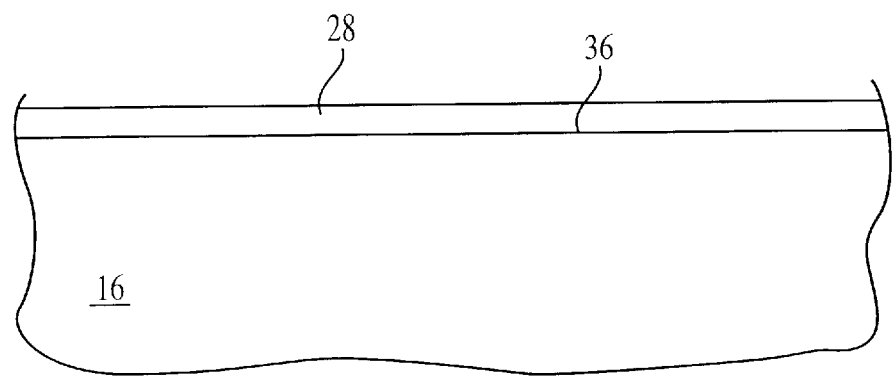
FIGS. 2–4 illustrate, in cross-section, process steps for the fabrication of an ONO structure in accordance with the invention.
Figure 3:
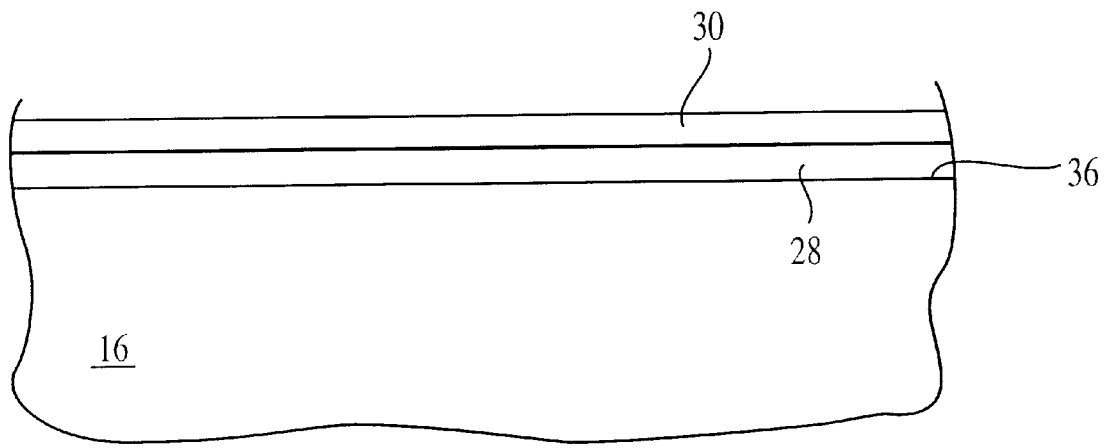
Figure 4:
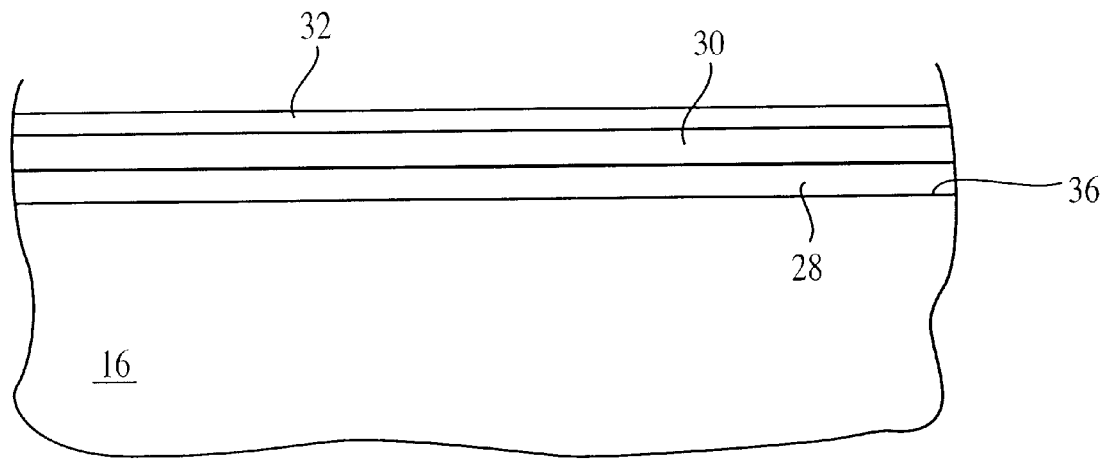

Referring to FIG. 2, first silicon dioxide layer 28 is formed to overlie the surface of semiconductor substrate 16. Preferably, semiconductor substrate 16 is a single crystal silicon substrate. Semiconductor substrate 16 has an upper surface 36 previously processed to remove debris and native oxides. A first silicon oxide layer 28 is formed to overlie upper surface 36. After forming first silicon oxide layer 28, silicon nitride layer 30 is formed to overlie first silicon oxide layer 28, as illustrated in FIG. 3. After forming silicon nitride layer 30, second silicon oxide layer 32 is formed to overlie silicon nitride layer 30, as illustrated in FIG. 4. Preferably, silicon nitride layer 30 is formed by either a low-pressure-chemical vapor deposition (LPCVD) process, a plasma-enhanced-chemical-vapor-deposition (PECVD) process, or a rapid thermal-chemical-vapor-deposition (RTCVP) process.

Preferably, first silicon oxide layer 28 is formed by either thermal oxidation or by PECVD using an RF power of about 100 W to about 700 W and, more preferably, about 200 W, and a temperature of about 300° C. to about 500° C. and, more preferably, about 400° C. The silicon oxide layer is preferably formed by reacting silane ($SiH_4$) and nitrous oxide ($N_2O$) in a nitrogen carrier gas.

For the formation of silicon-rich silicon nitride, the PECVD process is preferably carried out at an RF power of about 100 W to about 700 W and, more preferably, about 600 W, and temperature of about 300° C. to about 500° C. and, more preferably, about 400° C. The silicon nitride material is preferably formed by reacting ammonia ($NH_3$) and silane, preferably at a pressure of about 200 mtorr to about 300 mtorr. The process is carried out for a period of time and at gas flow rates sufficient to form a silicon-rich silicon nitride layer preferably having a thickness of about 20 to about 50 angstroms and, more preferably, about 30 angstroms. In one embodiment of the invention, ammonia is introduced in the PECVD apparatus at a flow rate of about 2 sccm to about 50 sccm and, more preferably, about 10 sccm, and silane is introduced at a flow rate of about 10 sccm to about 100 sccm and, more preferably, about 50 sccm.

In accordance with another embodiment of the invention, silicon nitride layer 30 can be formed by a low-pressure-chemical-vapor-deposition (LPCVD) process. To form a silicon-rich silicon nitride layer, preferably about 20 sccm to about 40 sccm of ammonia, and about 30 sccm to about 400 sccm and, more preferably, about 300 sccm of dichlorosilane ($SiCl_2H_2$) are introduced to an LPCVD system. The deposition is preferably carried out at a pressure of about 200 mtorr to about 300 mtorr, at a temperature of about 700° C. to about 750° C.

In yet another embodiment of the invention, a silicon-rich silicon nitride layer is formed by a rapid-thermal-chemical-vapor-deposition (RTCVD) process. Preferably, about 0.5 slpm to about 1.5 slpm of ammonia and about 200 sccm to about 350 sccm of silane are introduced to an RTCVD apparatus. The deposition process is preferably carried out at a temperature of about 650° C. to about 800° C. and a pressure of about 50 torr to 100 torr.

After forming silicon nitride layer 30, second silicon oxide layer 32 is formed by either a chemical-vapor-deposition (CVD) process or a PECVD process, as described above or, alternatively, by a thermal oxidation process. If is important to note that the silicon-rich silicon nitride layer can be readily oxidized to form a silicon oxide layer thereon. Accordingly, a silicon oxide layer can be immediately formed on the surface of silicon nitride layer by subjecting silicon nitride layer 30 to an oxidizing atmosphere at elevated temperature.

Following the formation of ONO structure 26, the stacked-gate structure shown in FIG. 1 is completed by depositing a layer of gate forming material overlying second silicon oxide layer 32. A lithographic patterning and etching process is then carried out to define control-gate electrode 34 and an ONO floating-gate electrode. Those skilled in the art will recognize that various gate-forming materials can be used to fabricate control-gate electrode 24. For example, control-gate electrode 24 can be formed with polycrystalline silicon, amphorous silicon, a refractory metal silicide and the like.

In another embodiment of the invention, a process for the fabrication of a stacked-gate advantageously incorporates an ONO structure as a dielectric material between a floating-gate electrode and a control-gate electrode. In a stacked-gate structure used in a non-volatile memory device, such as an electrically-erasable-read-only-memory (EEPROM) device, an ONO layer is typically employed to electrically isolate a floating-gate electrode from a control-gate electrode.

Figure 5:
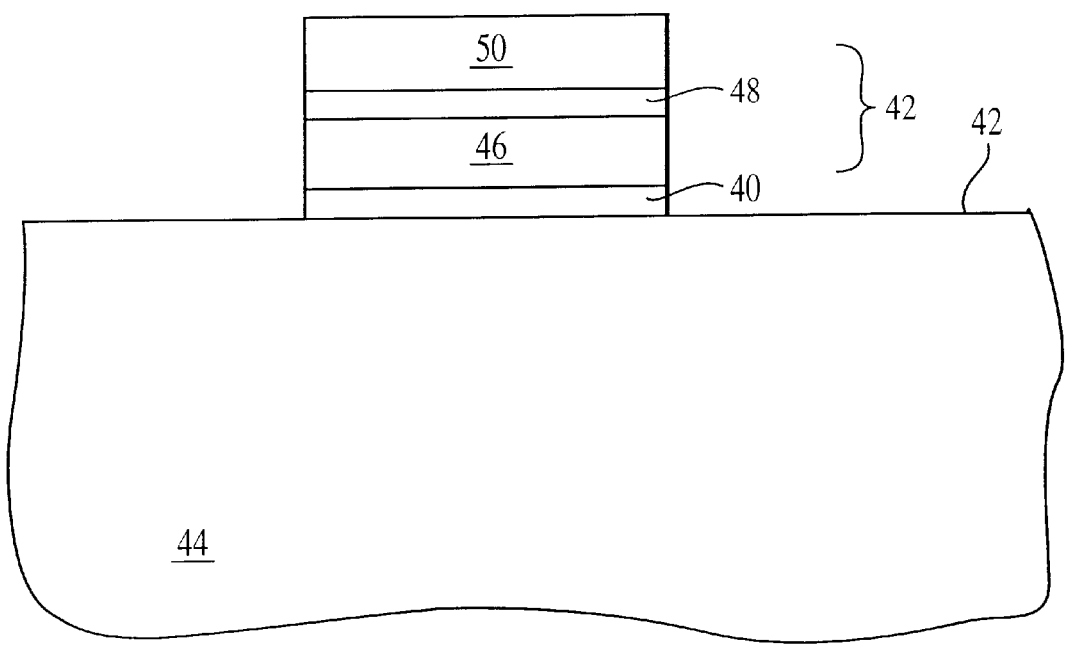
FIG. 5 illustrates, in cross-section, a stacked-gate device fabricated in accordance with the invention.

As illustrated in FIG. 5, a stacked-gate structure is fabricated by initially forming a first dielectric layer 40 overlying a surface 42 of a semiconductor substrate 44. A floating-gate electrode 46 is formed to overlie first dielectric layer 40. Floating-gate electrode 46 can be, for example, polycrystalline silicon doped with an n-type dopant, such as phosphorus or arsenic, to impart electrical conductivity to the polycrystalline silicon. Alternatively, floating-gate electrode 46 can be a refractory metal silicide and the like. An ONO 48 is formed to overlie floating-gate electrode 46 and a control-gate electrode 50 is formed to overlie ONO layer 48. Preferably, control-gate electrode 50 is fabricated using a material substantially similar to that used to fabricate floating-gate electrode 46.

Thus, there has been disclosed in accordance with the invention a process for fabricating an ONO structure having a silicon-rich silicon nitride layer that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A process for fabricating an ONO layer in a non-volatile memory device comprising:
   providing a semiconductor substrate;
   forming a first silicon oxide layer overlying the semiconductor substrate;
   forming a silicon-rich silicon nitride layer overlying the first silicon oxide layer using a RTCVD process, the RTCVD process comprising depositing the silicon nitride layer using an ammonia flow rate of about 0.5 slpm to about 1.5 slpm and a silane flow rate of about 200 sccm to about 350 sccm; and
   forming a second silicon oxide layer overlying the silicon nitride layer.

2. The process of claim 1, wherein forming a second silicon oxide layer comprises thermal oxidation of the silicon nitride layer.

3. A process for fabricating a stacked-gate structure including an ONO floating-gate electrode in a two-bit EEPROM device comprising:
   providing a semiconductor substrate having a first bit-line oxide layer and a second bit-line oxide layer therein separated by a substrate surface region;
   forming an ONO layer on the substrate surface region, wherein the ONO layer includes a first silicon oxide layer, a silicon rich silicon nitride layer, and second silicon oxide layer, the silicon rich silicon nitride layer formed by a RTCVD process, the RTCVD process comprising depositing the silicon nitride layer using an ammonia flow rate of about 0.5 slpm to about 1.5 slpm and a silane flow rate of about 200 sccm to about 350 sccm;

depositing a gate electrode layer overlying the ONO layer; and forming a stacked-gate structure on the substrate surface region, wherein the stacked-gate structure includes a control-gate electrode overlying an ONO floating gate electrode.

4. The process of claim 3, wherein forming an ONO layer comprises forming a second silicon oxide layer by thermal oxidation of the silicon nitride layer.

5. A process for fabricating a stacked-gate in a non-volatile memory device comprising:

providing a semiconductor substrate having a silicon surface region;

forming a first dielectric layer overlying the semiconductor substrate;

forming a floating-gate layer overlying the first dielectric layer;

forming an ONO layer overlying the floating gate layer, wherein the ONO layer includes a silicon rich silicon nitride layer formed by a RTCVD process, the RTCVD process comprising depositing the silicon nitride layer using an ammonia flow rate of about 0.5 slpm to about 1.5 slpm and a silane flow rate of about 200 sccm to about 350 sccm;

forming a control-gate layer overlying the ONO layer; and patterning the control-gate layer, the ONO layer, and the floating-gate layer to form a stacked-gate structure.

6. The process of claim 5, wherein forming an ONO layer comprises forming a second silicon oxide layer by thermal oxidation of the silicon nitride layer.

* * * * *